US012764947B2

(12) United States Patent
Zhang et al.

(10) Patent No.: US 12,764,947 B2
(45) Date of Patent: Oct. 13, 2026

(54) STAIRCASE CONNECTION STRUCTURE FOR THREE-DIMENSIONAL MEMORY DEVICES

(71) Applicant: Yangtze Memory Technologies Co., Ltd., Wuhan (CN)

(72) Inventors: Kun Zhang, Wuhan (CN); Linchun Wu, Wuhan (CN); Cuicui Kong, Wuhan (CN); Wenxi Zhou, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 359 days.

(21) Appl. No.: 18/323,227

(22) Filed: May 24, 2023

(65) Prior Publication Data

US 2024/0355734 A1 Oct. 24, 2024

(30) Foreign Application Priority Data

Apr. 23, 2023 (CN) ......................... 202310441563.3

(51) Int. Cl.

| | |
|---|---|
| ***H10B 41/20*** | (2023.01) |
| ***H10B 41/27*** | (2023.01) |
| ***H10B 43/10*** | (2023.01) |
| ***H10B 43/20*** | (2023.01) |
| ***H10B 43/27*** | (2023.01) |
| ***H10B 43/35*** | (2023.01) |
| ***H10B 51/20*** | (2023.01) |
| ***H10B 53/20*** | (2023.01) |

(52) U.S. Cl.
CPC ............. *H10B 41/20* (2023.02); *H10B 41/27* (2023.02); *H10B 43/10* (2023.02); *H10B 43/20* (2023.02); *H10B 43/27* (2023.02); *H10B 43/35* (2023.02); *H10B 51/20* (2023.02); *H10B 53/20* (2023.02)

(58) Field of Classification Search
CPC ........ H10B 42/20; H10B 42/27; H10B 43/20; H10B 43/27; H10B 51/20; H10B 53/20
See application file for complete search history.

(56) References Cited

U.S. PATENT DOCUMENTS

| | | | | |
|---|---|---|---|---|
| 8,427,878 B2 * | 4/2013 | Shim | G11C 16/08 | |
| | | | 365/185.23 | |
| 9,613,975 B2 * | 4/2017 | Huang | H10B 43/35 | |
| 12,512,158 B2 * | 12/2025 | Chen | G11C 16/08 | |
| 2024/0063140 A1 * | 2/2024 | Xie | H10B 43/50 | |
| 2026/0136517 A1 * | 5/2026 | Liaw | H10B 10/125 | |
| 2026/0136548 A1 * | 5/2026 | Kim | H10B 41/27 | |

* cited by examiner

*Primary Examiner* — David A Zarneke
(74) *Attorney, Agent, or Firm* — Conley Rose, P.C.

(57) ABSTRACT

A memory device can include channel structures in a first region. The memory device can also include a plurality of word line cavity structures in a second region abutting the first region. The plurality of word line cavity structures can extend along a first direction. Each of the word line cavity structures can include a first contact structure in a first side of the word line cavity structure along a second direction perpendicular to the first direction. Each of the word line cavity structures can also include a second contact structure in a second side of the word line cavity structure along the second direction. The second side can be opposite to the first side. Each of the word line cavity structures can further include a slit structure. The first contact structure and the second contact structure can be separated with the slit structure along the second direction.

20 Claims, 17 Drawing Sheets

STAIRCASE CONNECTION STRUCTURE FOR THREE-DIMENSIONAL MEMORY DEVICES

CROSS-REFERENCE TO RELATED APPLICATIONS AND INCORPORATED BY REFERENCE

This application claims priority to Chinese Patent Application No. 202310441563.3 filed on Apr. 23, 2023, which is incorporated herein by reference in its entirety.

TECHNICAL FIELD

The present disclosure generally relates to the field of semiconductor technology, and more particularly, to a three-dimensional (3D) memory device.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques have become challenging and costly. As such, memory density for planar memory cells approaches an upper limit. A three-dimensional (3D) memory architecture can address the density limitation in planar memory cells.

BRIEF SUMMARY

Embodiments of three-dimensional (3D) memory device with staircase connection structures and methods for forming the same are described in the present disclosure.

In some embodiments, a memory device includes channel structures in a first region. The memory device also includes a plurality of word line cavity structures in a second region abutting the first region. The plurality of word line cavity structures can extend along a first direction. Each of the word line cavity structures includes a first contact structure in a first side of the word line cavity structure along a second direction perpendicular to the first direction. Each of the word line cavity structures also includes a second contact structure in a second side of the word line cavity structure along the second direction. The second side can be opposite to the first side. Each of the word line cavity structures further includes a slit structure. The first contact structure and the second contact structure can be separated with the slit structure along the second direction.

In some embodiments, the first contact structure or the second contact structure can include a lateral contact portion positioned along the second direction and extending along the first direction.

In some embodiments, the first contact structure or the second contact structure can include a vertical contact portion connected with the lateral contact portion.

In some embodiments, the first contact structure or the second contact structure can include a gate dielectric layer, a first conductive material layer and a second conductive material layer.

In some embodiments, the first and second directions can be parallel to a top surface of a substrate.

In some embodiments, the plurality of the word line cavity structures can form a staircase structure in the second region. The each of the plurality of the word line cavity structures can form a step in the staircase structure in the second region.

In some embodiments, a number of steps can increase along the first direction.

In some embodiments, a number of steps can decrease along the first direction.

In some embodiments, the plurality of word line cavity structures can further include a first word line cavity structure, and a second word line cavity structure. The first word line cavity structure can be located at a different height in a third direction than the second word line cavity structure. The third direction can be orthogonal to the first direction and the second direction.

In some embodiments, the first word line cavity structure can include a first width in the second direction. The second word line cavity structure can include a second width in the second direction. The first width and the second width can be approximately the same.

In some embodiments, the first word line cavity structure can be aligned with the second word line cavity structure at a same location along the first direction.

In some embodiments, a first dielectric layer can be sandwiched between the first word line cavity structure and the second word line cavity structure in the third direction.

In some embodiments, the first word line cavity structure cannot be electrically connected with the second word line cavity structure.

In some embodiments, the plurality of word line cavity structures can further include a third word line cavity structure. The second word line cavity structure can be located at a same height in the third direction as the second word line cavity structure.

In some embodiments, the third word line cavity structure can be electrically connected with the second word line cavity structure.

In some embodiments, the third word line cavity structure can be separated by a distance with the second word line cavity structure in the first direction.

In some embodiments, the first word line cavity structure, the second word line cavity structure, and the third word line cavity structure can form a staircase structure in the second region.

In some embodiments, the second word line cavity structure and the third word line cavity structure can be connected with a conductive path to the channel structures.

In some embodiments, an electrical conductivity of the each of the word line cavity structures can be associated with a cross-sectional area of the first contact structure and the second contact structure. The cross-sectional area can include the cross-sectional area in the first direction and the second direction.

In some embodiments, the first contact structure can be separated with the slit structure by a first distance in the second direction. The second contact structure can be separated with the slit structure by a second distance in the second direction. The first distance can be substantially the same as the second distance.

In some embodiments, a memory system includes a controller, and a memory device coupled to the controller. The memory device includes channel structures in a first region. The memory device also includes a plurality of word line cavity structures in a second region abutting the first region. The plurality of word line cavity structures can extend along a first direction. Each of the word line cavity structures includes a first contact structure in a first side of the word line cavity structure along a second direction perpendicular to the first direction. Each of the word line cavity structures also includes a second contact structure in a second side of the word line cavity structure along the second direction. The second side can be opposite to the first side. Each of the word line cavity structures further includes a slit structure. The first contact structure and the second contact structure can be separated with the slit structure along the second direction.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person of skill in the pertinent art to make and use the present disclosure.

Figure 1A:
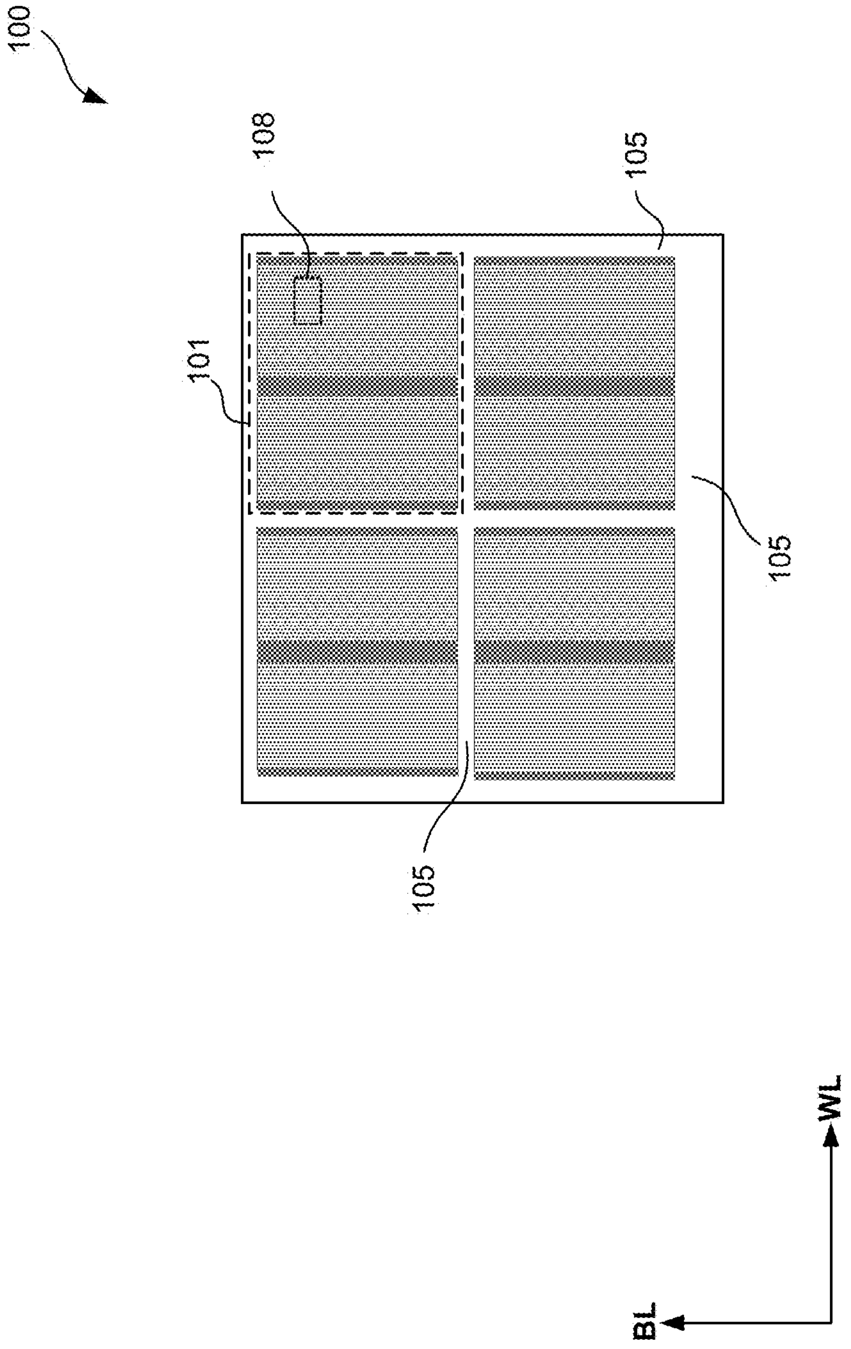
FIG. 1A illustrates a schematic top-down view of an exemplary three-dimensional (3D) memory chip, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of lateral planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" and "substantially" indicate the value of a given quantity that can vary based on a particular technology node associated with the subject semiconductor device. Based on the particular technology node, the term "about" and "substantially" can indicate a value of a given quantity that varies within, for example, 10-30% of the value (e.g., +10%, +20%, or +30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As the development of 3D memory (e.g., 3D NAND flash memory) progress towards high density and high capacity memory cells, the number of staircase layers in 3D memory devices continues to increase. Each level of the staircase structure can be used as a word line of the 3D memory device. A level of the staircase structure can include a step, such as a portion of the level that is offset from another adjacent level. The step of the staircase structure can be electrically and physically connected to a contact that extends through an insulating layer that covers the staircase structure. As the number of staircase layers increases, aspect ratios of the contacts also increase and can cause etching variation, which can occur in openings formed to expose each step of the staircase structure. Word line contacts can be formed by etching openings through the insulating layer and exposing underlying steps of the staircase structures, followed by deposition processes that fill the openings with one or more conductive materials. Over-etching the exposed steps can lead to a "punch through" of the step and cause shorts between adjacent word lines.

Various embodiments in accordance with the present disclosure provide structures and fabricating methods for forming self-aligning word line contact structures in 3D memory devices.

Figure 1B:
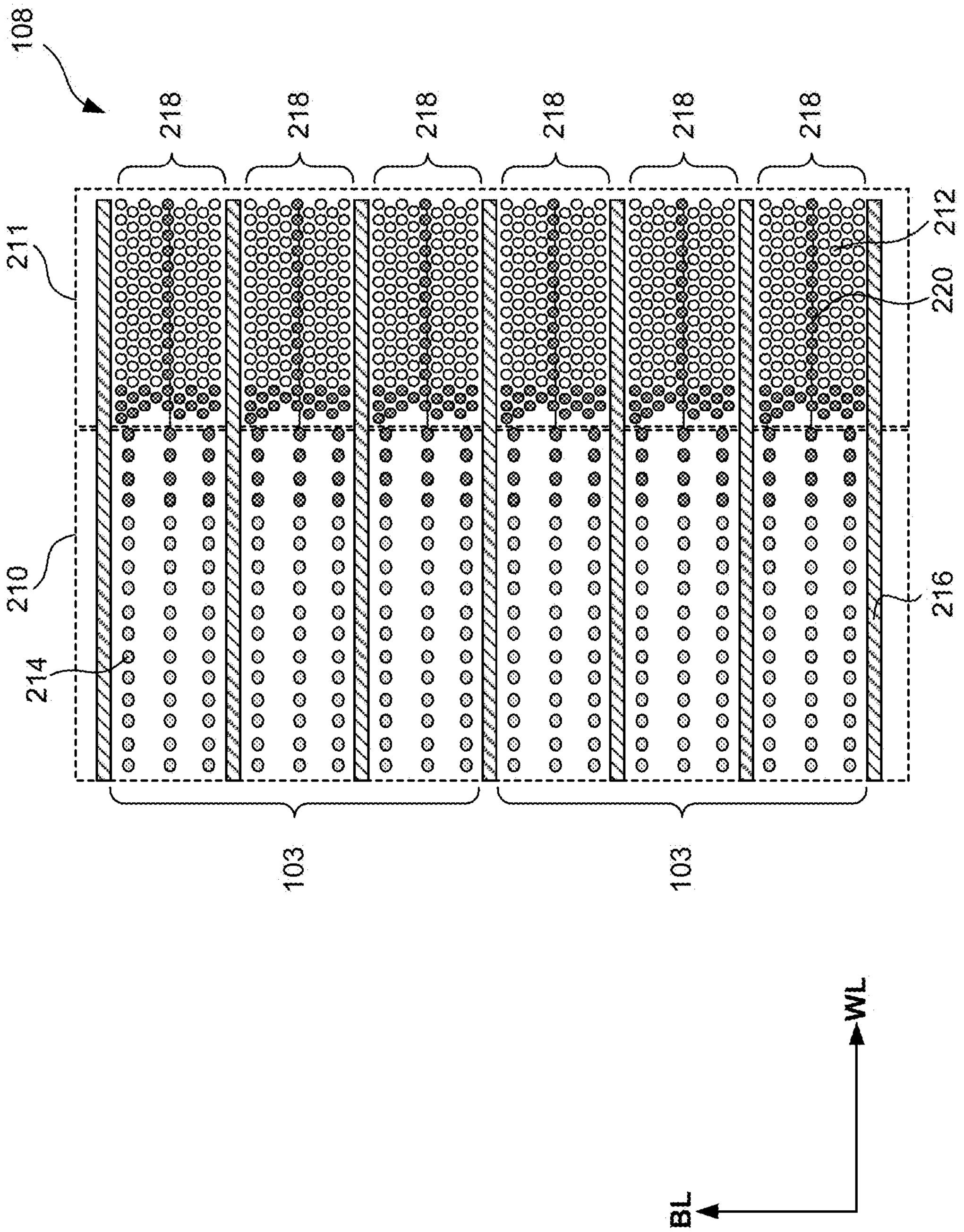
FIG. 1B illustrates a schematic top-down view of a region of a 3D memory chip, according to some embodiments of the present disclosure.

FIGS. 1A and 1B are top-down illustrations of 3D memory device 100, according to some embodiments of the present disclosure. FIG. 1A illustrates a top-down view of an exemplary 3D memory device 100 and FIG. 1B is a top-down enlarged view of a region of 3D memory device 100, according to some embodiments of the present disclosure. 3D memory device 100 can be a memory chip or any portion of a memory chip, and can include one or more memory planes 101, each of which can include memory blocks. The arrangement of memory planes, memory blocks, and memory fingers illustrated in FIGS. 1A and 1B are only provided as an example, which does not limit the scope of the present disclosure.

As shown in FIG. 1A, exemplary 3D memory device 100 includes four memory planes 101 and each memory plane 101 includes multiple memory blocks. Identical and concurrent operations can take place at each memory plane 101. Memory blocks can be megabytes (MB) in size and can be the smallest size to carry out erase operations. Each memory block can include memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIGS. 1A and 1B. The memory array is the core area in a memory device, performing storage functions.

3D memory device 100 can include a periphery region 105, an area surrounding memory planes 101. Periphery region 105 can contain many digital, analog, and/or mixed-signal circuits (not illustrated in FIG. 1A for simplicity) to support functions of the memory array, for example, page buffers, row and column decoders and sense amplifiers. Peripheral circuits can include active and/or passive semiconductor devices, such as transistors, diodes, capacitors, resistors, and any suitable devices.

Referring to FIG. 1B, a top-down illustration of a region 108 in FIG. 1A is illustrated, according to some embodiments of the present disclosure. Region 108 of 3D memory device 100 can include a staircase region 210 and a channel region 211. In this disclosure, memory block 103 is also referred to as a "memory array" or "array." Channel region 211 can include an array of memory strings 212, each including stacked memory cells. Staircase region 210 can include a staircase structure and an array of contact structures 214 formed on the staircase structure. In some embodiments, slit structures 216, extending in WL direction across channel region 211 and staircase region 210, can divide a memory block into multiple memory fingers 218. At least some slit structures 216 can function as the common source contact for an array of memory strings 212 in channel regions 211. A top select gate cut 220 can be disposed in the middle of each memory finger 218 to divide a top select gate (TSG) of memory finger 218 into two portions, and thereby can divide a memory finger into two programmable (read/write) pages. While erase operation of a 3D NAND memory can be carried out at memory block level, read and write operations can be carried out at memory page level. In some embodiments, region 108 can include dummy memory strings for process variation control during fabrication and/or for additional mechanical support.

Figure 2:
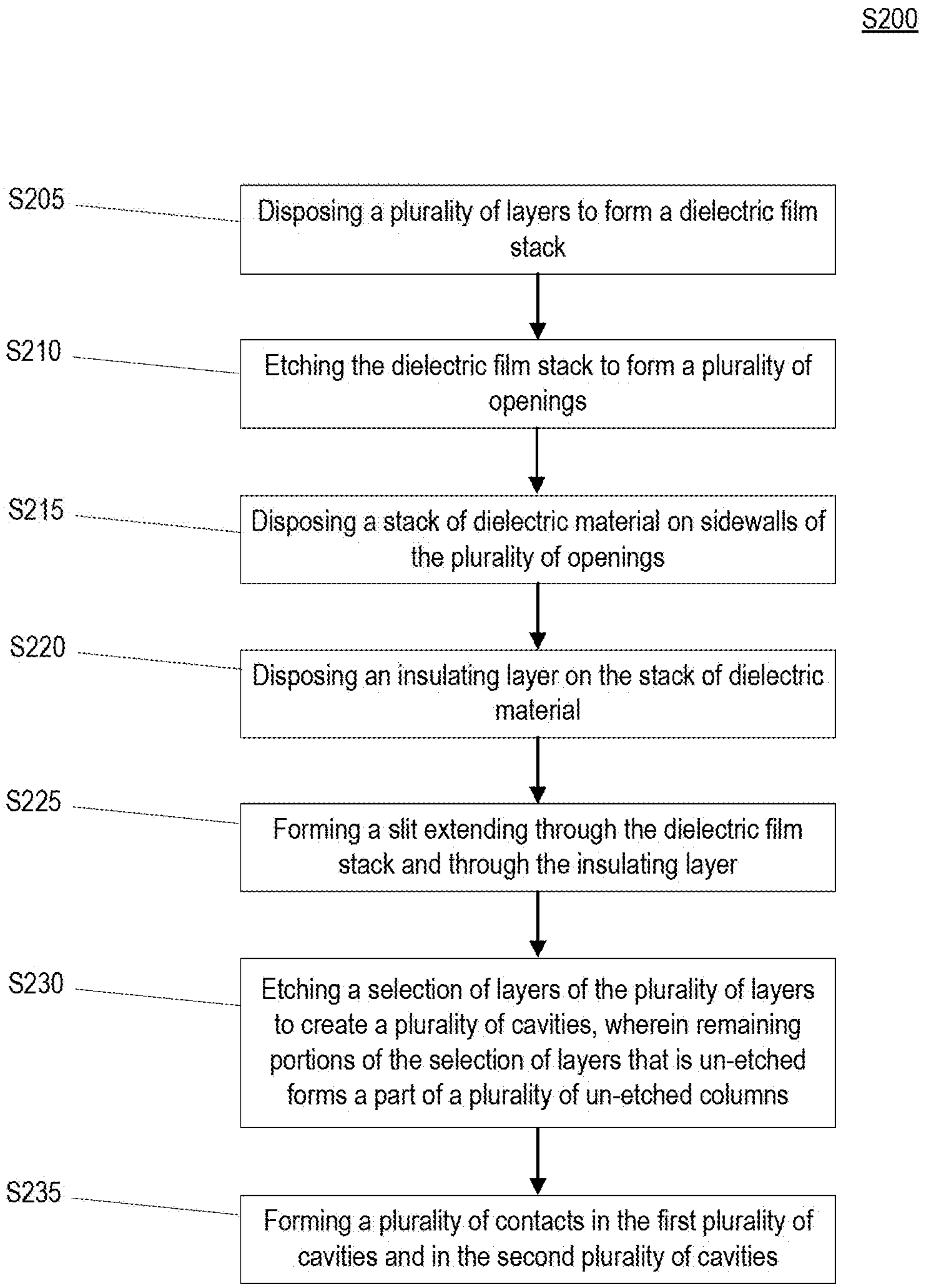
FIG. 2 illustrates a flow diagram of forming an exemplary three-dimensional (3D) memory device, according to some embodiments of the present disclosure.

FIG. 2 illustrates a flow diagram of an exemplary method S200 for forming self-aligning word line contact structures in 3D memory devices, in accordance with some embodiments of the present disclosure. Operations of method S200 can be performed in a different order and/or vary, and method S200 can include more operations that are not described for simplicity. FIGS. 3A-9B are cross-sectional views of semiconductor structure 300 during various fabrication stages for forming self-aligning word line contact structures. In some embodiments, semiconductor structure 300 can be a portion of a 3D NAND memory device. The fabrication processes provided here are exemplary. Alternative processes in accordance with this disclosure can be performed and are not shown in these figures.

Figure 3A:
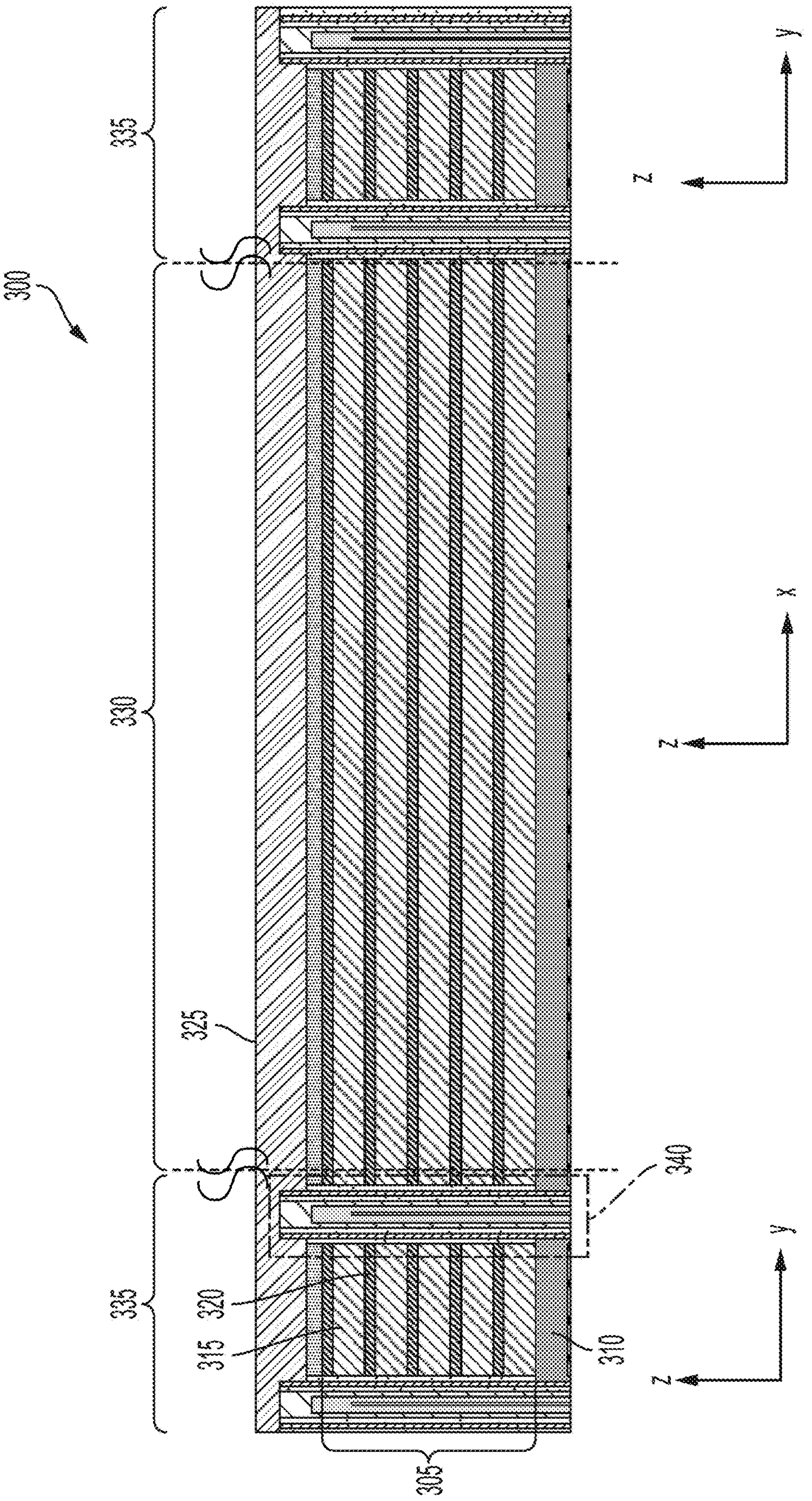
FIGS. 3A, 3B, 4-7, 8A-8C, 9A and 9B illustrate schematic cross-sectional views of various fabrication stages of a 3D memory device, according to some embodiments of the present disclosure.

Referring to FIG. 2, at operation S205, a dielectric film stack and channel structures are disposed on a substrate, according to some embodiments. As shown in FIG. 3A, semiconductor structure 300 can include a dielectric film stack 305 disposed on a substrate 310, according to some embodiments. In some embodiments, a first dielectric layer 315 and a second dielectric layer 320 can be alternatingly disposed on substrate 310 to form dielectric film stack 305. In some embodiments, first dielectric layer 315 can be formed using a silicon nitride material. In some embodiments, second dielectric layer 320 can be formed using a silicon oxide material. First dielectric layer 315 and second dielectric layer 320 can be disposed using one or more thin-layer deposition processes including, but not limited to, chemical vapor deposition (CVD), plasma-enhanced CVD (PECVD), physical vapor deposition (PVD), atomic layer deposition (ALD), plasma-enhanced ALD (PEALD), or any combinations thereof. In some embodiments, thicknesses of first dielectric layers 315 can be the same or different. Similarly, thicknesses of second dielectric layers 320 can be the same or different. In some embodiments, an optional oxide layer 325 can be formed on the top-most layer of dielectric film stack 305.

Substrate 310 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, substrate 310 can be double-side polished prior to device fabrication. Substrate 310 can be a multi-layer structure including one or more suitable sub-layers. For example, substrate 310 can include a base formed using silicon and an oxide layer formed of silicon oxide.

For ease of description, semiconductor structure 300 can be divided into a staircase region 330 and a channel region 335. FIGS. 3A-9B illustrate an x-directional view of staircase region 330 and a y-directional view of channel region 335. In some aspects, staircase region 330 and channel region 335 may be separated from each other, as shown in FIGS. 3A-9B.

Figure 3B:
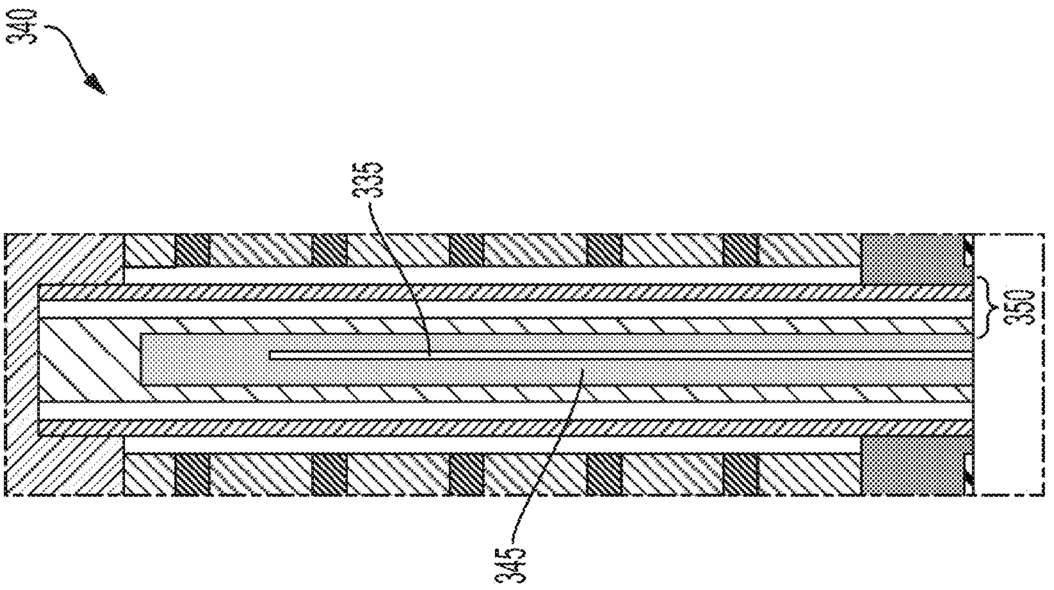

Channel structures 340 can be formed in channel region 335. In some embodiments, channel structures 340 extend through dielectric film stack 305. Referring to FIG. 3B, channel structure 340 includes a channel layer 345 surrounded by a function layer 350. In some embodiments, function layer 350 contains a tunneling layer, a charge storage layer, and a blocking layer, arranged along a direction from the center of each channel layer 345 toward dielectric film stack 305. In some embodiments, an air gap 355 can be embedded in channel layer 345 to reduce stress within channel structure 340.

Referring to FIG. 2, at operation S210, a staircase structure 400 is formed by etching dielectric film stack 305 to form openings 405, according to some embodiments.

Figure 4:
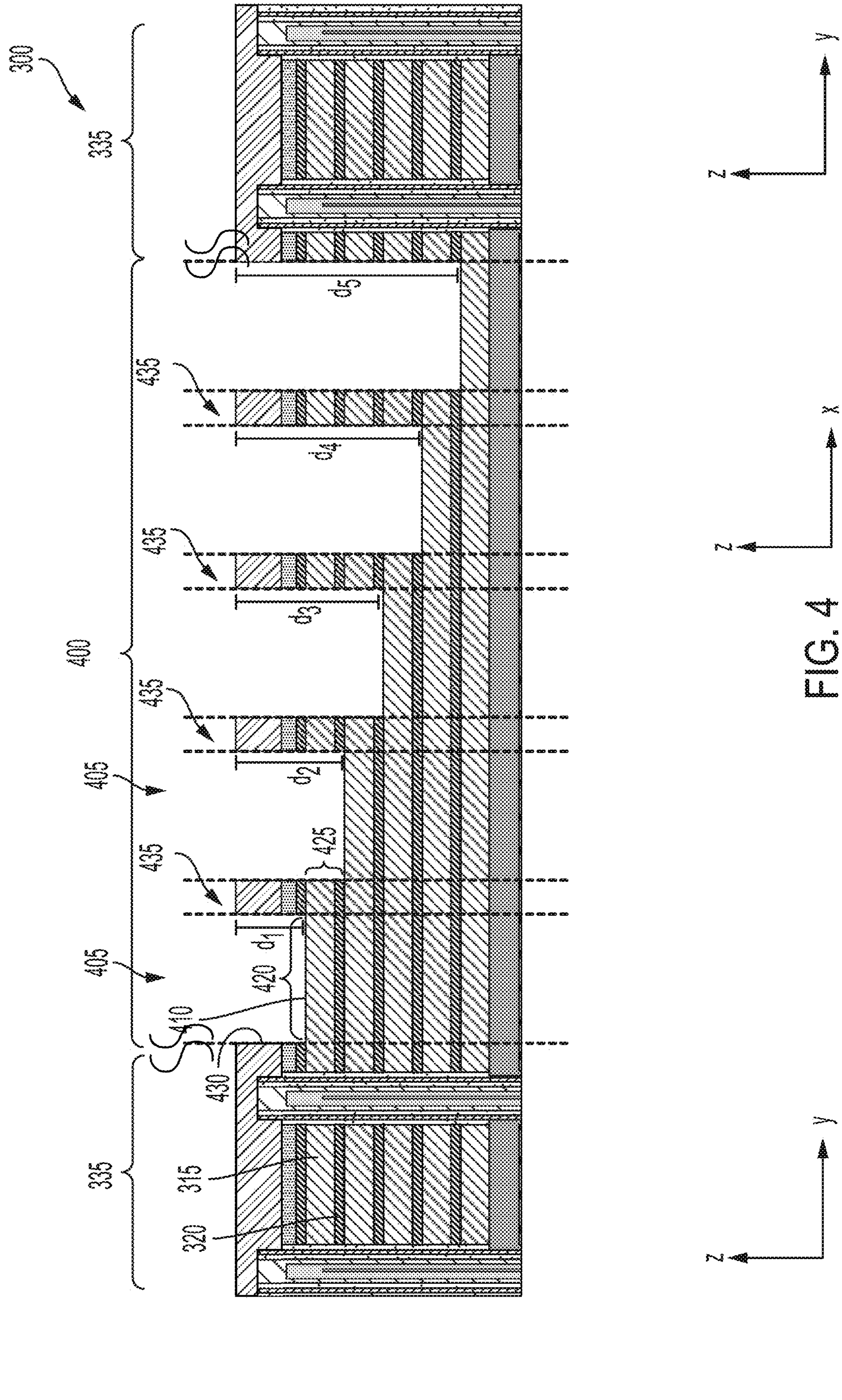

As shown in FIG. 4, each opening 405 is separated by an un-etched column 435 that forms sidewalls 430 of each opening 405. Each opening 405 further exposes a lateral surface 410 of one layer of dielectric film stack 305. In some embodiments, each opening 405 exposes lateral surface 410 of one layer in first dielectric layers 315 in dielectric film stack 305. In some embodiments (not depicted), each opening 405 exposes lateral surface 410 of one layer in second dielectric layers 320 in dielectric film stack 305. The exposed lateral surface 410 can be referred to as a step 420 in staircase structure 400. In the depicted embodiment of FIG. 4, openings 405 can be etched to different depths $d_{1-5}$ such that steps 420, each exposing a different layer in dielectric film stack 305, are formed to make staircase structure 400. Each step 420 includes a level 425 of dielectric film stack 305. In some embodiments, each level 425 in staircase structure 400 includes one dielectric layer pair that includes one first dielectric layer 315 and one second dielectric layer 320. In some embodiments, each level 425 in staircase structure 400 includes multiple dielectric layer pairs including multiple first dielectric layers 315 and multiple second dielectric layers 320 disposed in an alternating manner. The number of dielectric layer pairs included in each level 425 of staircase structure 400 described herein is not exhaustive, and other combinations of first and second dielectric layers 315, 320 can be included in each level 425.

Openings 405 can be formed using a "trim-etch" multi-cycle process. For example, a masking layer (e.g., photoresist layer, not illustrated in FIG. 4) that is patterned using a suitable photolithography process can be used to cover certain portions of dielectric film stack 305 during the fabrication process of staircase structure 400. The "trim-etch" multi-cycle process can form multiple steps 420 in dielectric film stack 305 with different depths $d_{1-5}$. The "trim-etch" multi-cycle process can include trimming the masking layer and etching a part of dielectric film stack 305 uncovered by the masking layer. For example, in a first cycle, the masking layer uncovers a first portion of dielectric film stack 305, and the uncovered portion is etched to a first stair depth to create a first opening 405. In a next cycle, the masking layer is further trimmed to expose an additional second portion of dielectric film stack 305. The newly exposed portion of dielectric film stack 305 is etched to the first stair depth during this next cycle, and the first portion of dielectric film stack 305 uncovered during the first cycle is further etched to a second stair depth deeper than the first stair depth. The cycles of trimming and etching can be repeated for a number of times based on the number of steps 420 desired to be formed in staircase structure 400.

In some embodiments, dielectric film stack 305 can include any suitable number of levels 425, such as 32 levels or greater. For example, FIG. 4 illustrates five levels 425 of staircase structure 400 and other levels are omitted for simplicity.

Figure 5:
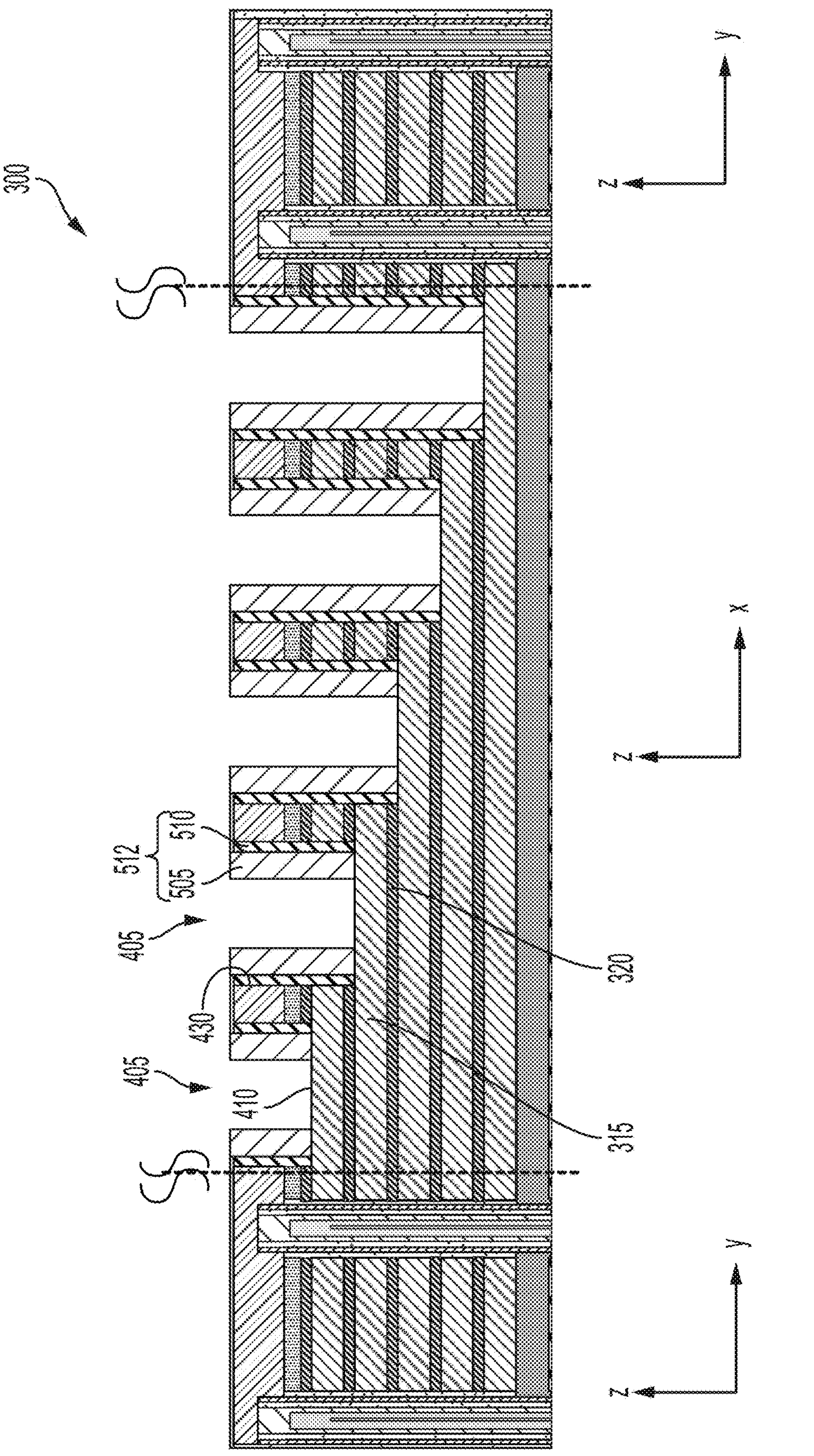

Referring to FIG. 2, at operation S215, as shown in FIG. 5, a stack of dielectric material 512 is disposed on sidewalls of openings, according to some embodiments. Stack of dielectric material 512 can include a first spacer layer 505 and a second spacer layer 510 disposed to contact sidewalls 430 and the exposed lateral surface 410 of each opening 405. In some embodiments, dielectric material 512 can be a continuous layer. In some embodiments, after disposing stack of dielectric material 512, sidewalls of first and second dielectric layers 315 and 320 in dielectric film stack 305 are no longer exposed by opening 405. In some embodiments, first spacer layer 505 can also be referred to as a sacrificial layer because it can be removed in subsequent fabrication steps. In some embodiments, when initially disposed, stack of dielectric material 512 substantially contours sidewalls 430 and lateral surfaces 410 in staircase structure 400. An additional anisotropic etching process can be performed to substantially remove stack of dielectric material 512 in the vertical direction (e.g., z-direction). As a result, stack of dielectric material 512 can remain on sidewalls 430 of openings 405 while stack of dielectric material 512 disposed on lateral surfaces 410 are substantially removed to expose lateral surface 410 of the previously exposed first dielectric layer 315.

In some embodiments, first spacer layer 505 can be formed using any suitable dielectric materials, such as silicon oxide, silicon nitride, silicon oxycarbide, silicon oxynitride, or combinations thereof. In some embodiments, first spacer layer 505 can be formed of silicon nitride or silicon oxide and formed by a wet oxidization process. For example, in some embodiments, where each opening 405 exposes a layer of first dielectric layers 315, first spacer layer 505 can be formed using the same material as first dielectric layer 315. On the other hand, in some embodiments, where each opening 405 exposes a layer of second dielectric layers 320, first spacer layer 505 can be formed using the same material as second dielectric layer 320. Still, in some embodiments, first spacer layer 505 can be formed using a different material from both first dielectric layer 315 and second dielectric layer 320. In some embodiments, first spacer layer 505 and second spacer layer 510 can each have a substantially uniform thickness.

Figure 6:
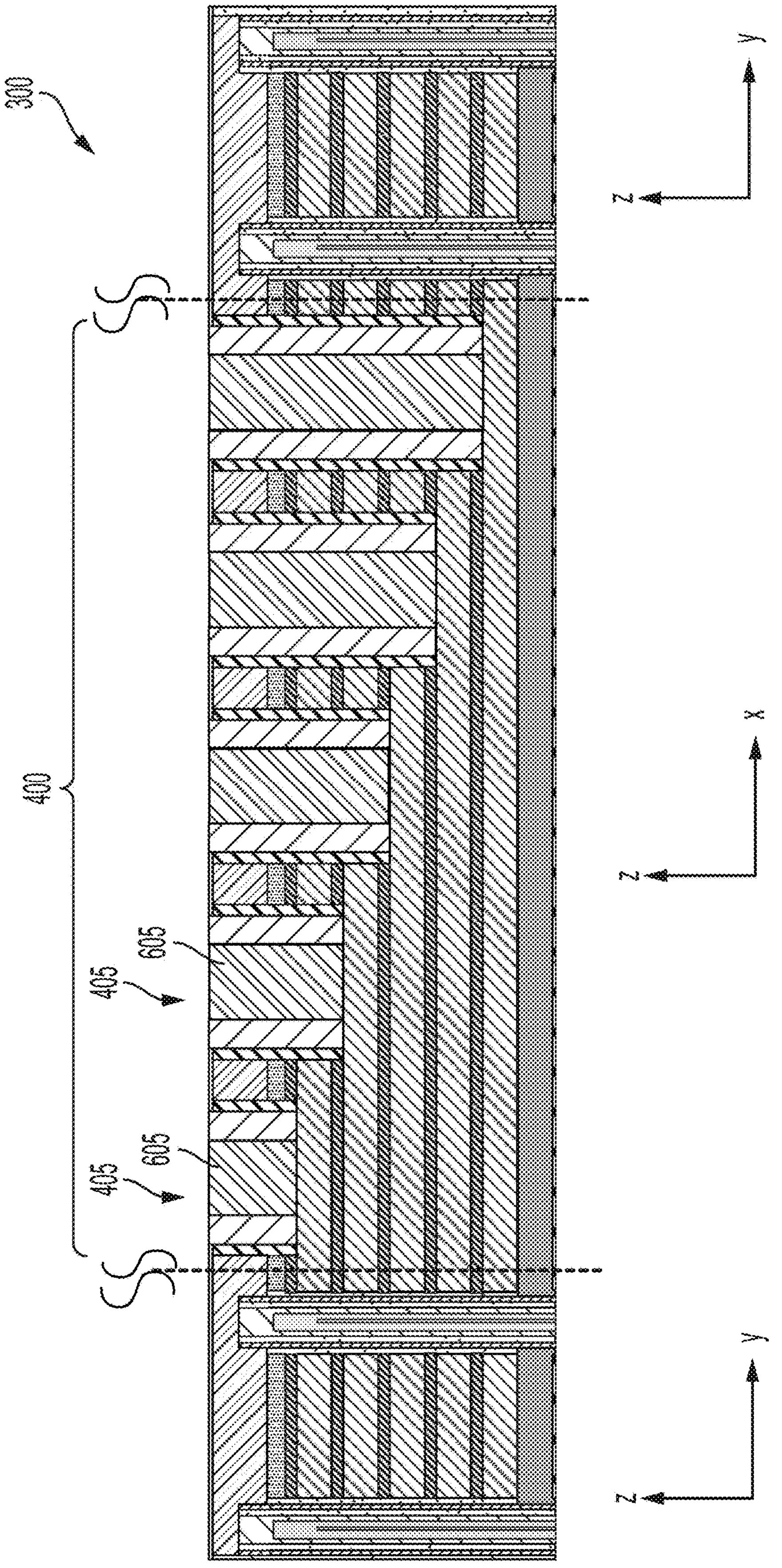

Referring to FIG. 2, at operation S220, an insulating layer 605 is disposed on stack of dielectric material 512 such that openings 405 are filled, according to some embodiments. As shown in FIG. 6, insulating layer 605 is disposed on staircase structure 400. In some embodiments, insulating layer 605 can be formed of a dielectric material similar to that of first dielectric layer 315 or second dielectric layer 320. For example, insulating layer 605 can be formed of silicon nitride or silicon oxide material. Insulating layer 605 can be formed using suitable deposition methods, such as CVD, PVD, PECVD, ALD, any suitable deposition methods, or any combinations thereof.

Figure 7:
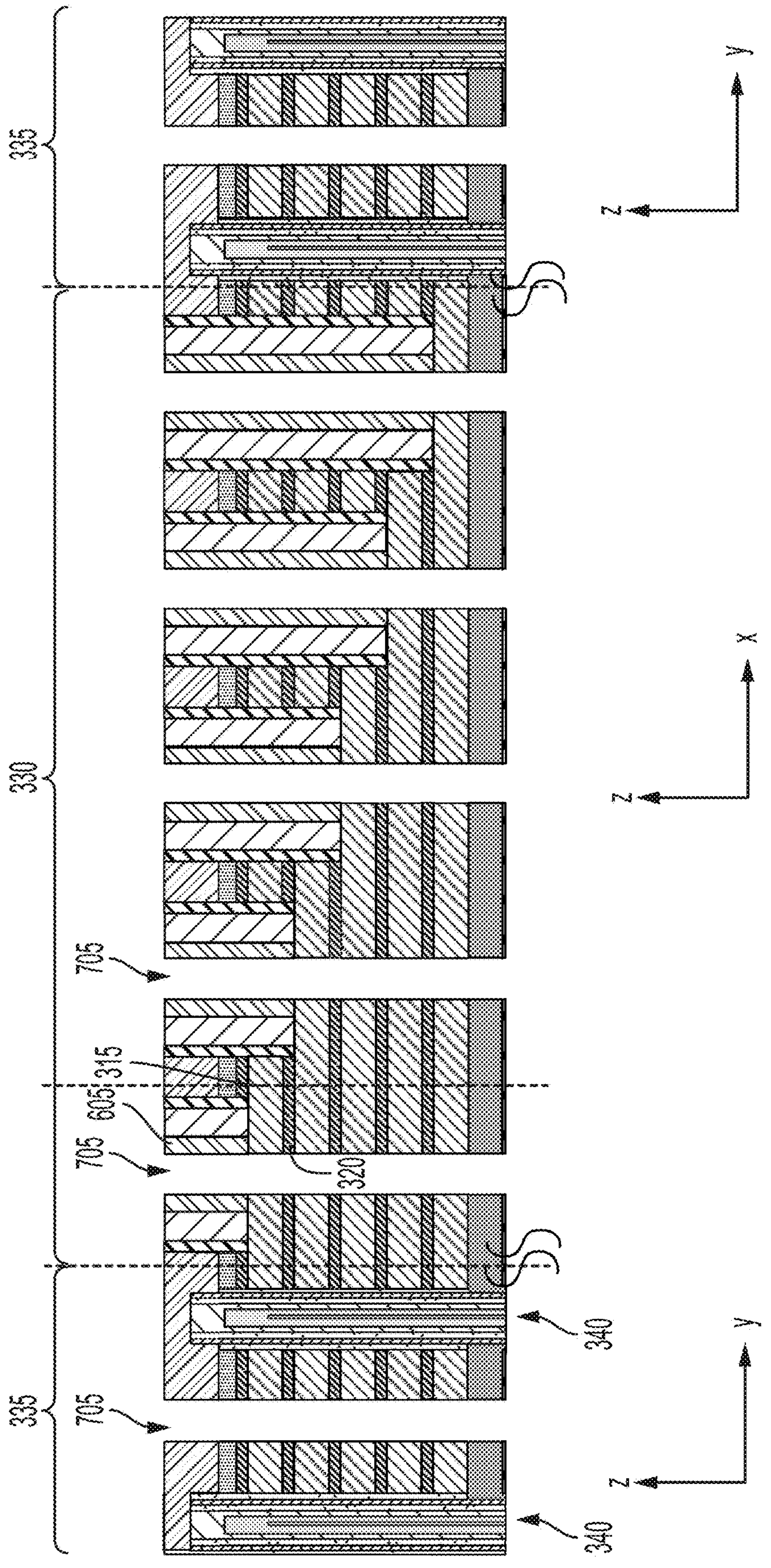

Referring to FIG. 2, at operation S225, slits 705 are formed that extend through dielectric film stack 305 and through insulating layer 605, according to some embodiments. As shown in FIG. 7, slits 705 can extend through dielectric film stack 305 and can be formed after insulating layer 605 is disposed, according to some embodiments. FIG. 7 shows slits 705 along the x-directional view in staircase region 330 and the y-directional view in channel region 335. In some aspects, each slit 705 can be a gate line slit and a gate line can be formed in the center of each slit 705, such as gate line 950 in FIGS. 9A and 10. In staircase region 330, each slit 705 is positioned to bisect insulating layer 605 disposed in each opening 405, thereby exposing sidewalls of insulating layer 605, first dielectric layers 315, and second dielectric layers 320. In channel region 335, each slit 705 can be positioned between channel structures 340 and can expose sidewalls of each layer in dielectric film stack 305. Slits 705 can be formed by suitable patterning and etching processes on dielectric film stack 305. Slits 705 provide the opening for the etching process of a selection of layers in dielectric film stack 305 to create the self-aligning word line contact structures, as described in further detail below.

Figure 8A:
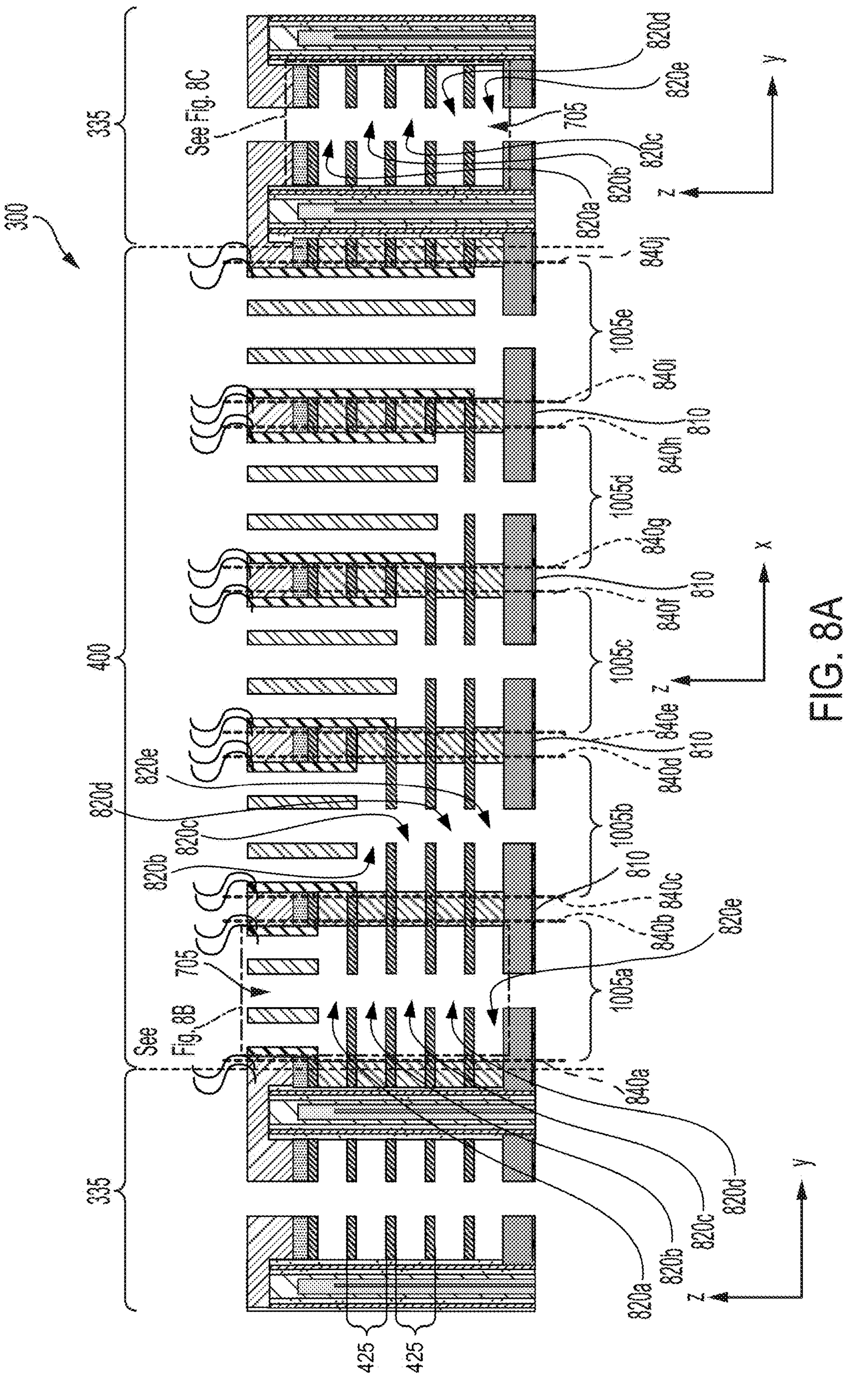

Referring to FIG. 2, at operation S230, a selection of layers in dielectric film stack 305 is etched to create first cavities 805 in staircase region 400, second cavities 806 in channel region 335, and remaining portions 810 in staircase region 400, according to some embodiments. As shown in FIG. 8A, slits 705 provide an opening for partial etching of the exposed sidewalls of the selection of layers in dielectric film stack 305. In some embodiments, partial etching can be conducted on each first dielectric layer 315 in dielectric film stack 305. In some embodiments, partial etching can be conducted on each second dielectric layer 320 in dielectric film stack 305. For example, a wet chemical process configured to etch silicon nitride material can be used to etch each first dielectric layer 315 in dielectric film stack 305. The amount of wet chemical used in the etching process can be varied to control the amount of etching of first dielectric layers 315 such that first dielectric layers 315 are not completely etched to form a continuous cavity through dielectric film stack 305. Rather, remaining portions 810 of dielectric film stack 305 remains after the etching process completes. An advantage of remaining portions 810 is that they can provide mechanical support for dielectric film stack 305 and prevent bending of the word line contacts formed in first cavities 805 and second cavities 806, as described in further detail below.

FIG. 8A illustrates multiple cross-sectional views arranged along the x-direction of staircase structure 400 and along the y-direction of channel regions 335. FIG. 8A includes multiple y-directional cross-sectional views arranged consecutively arranged along the x-direction for convenience of presentation. Specifically, reference lines 840*a*-840*j* show cross-sectional views along reference planes 1005*a*-1005*e*, shown in FIG. 10. Reference planes 1005*a*-1005*e* may be illustrated as examples and more or less reference planes may be implemented. The cross-sectional views of 1005*a*-1005*e* may be placed consecutively in FIG. 8A for simplicity and convenience of presentation, but it should be noted that each consecutive reference plane 1005*a*-1005*e* span across the x-direction of semiconductor 1000 shown in FIG. 10.

Figure 10:
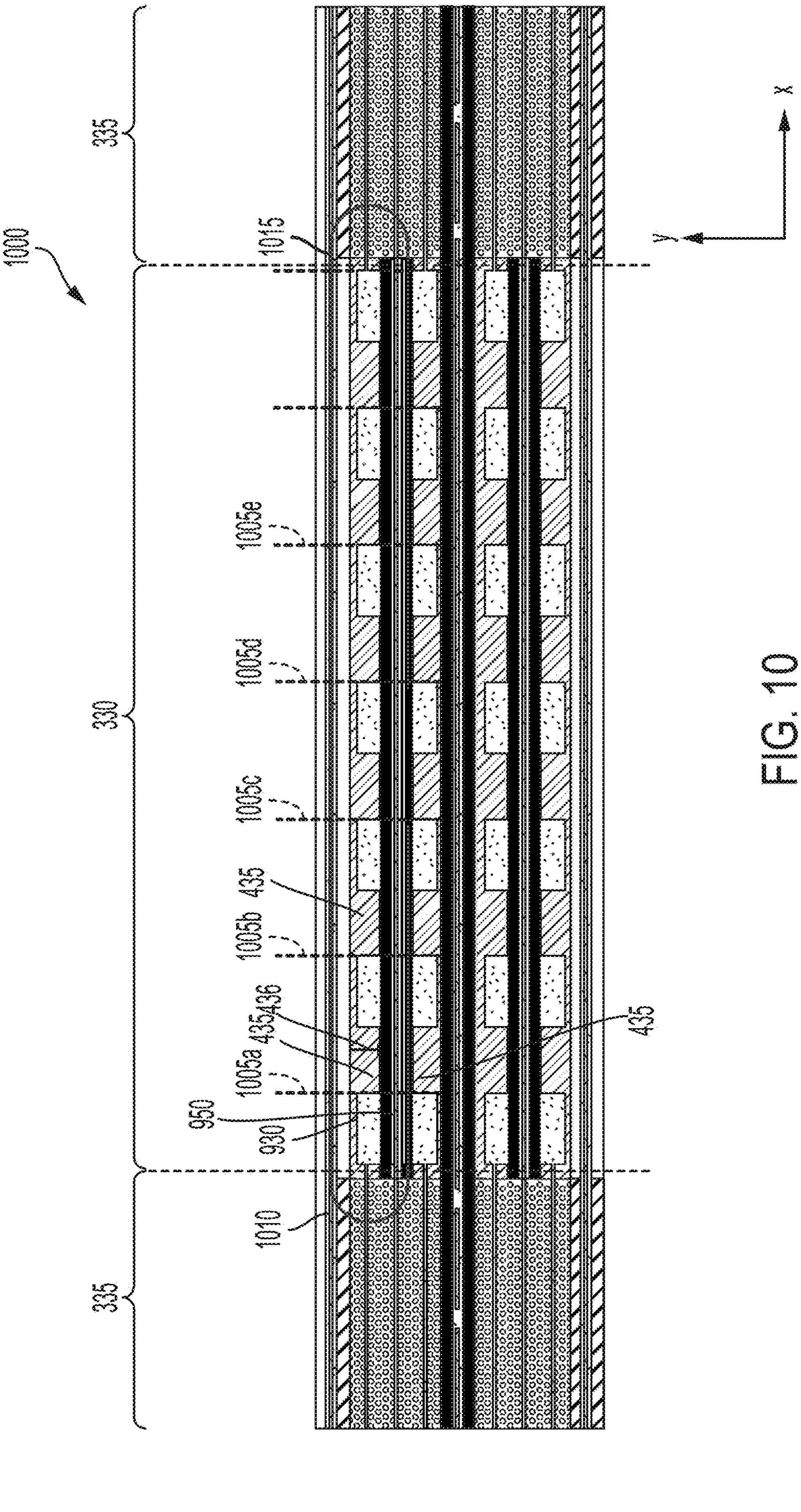
FIG. 10 illustrates a schematic top-down view of a region of a 3D memory chip, according to some embodiments of the present disclosure.

Each of the reference planes 1005*a*-1005*e* may be separated with each other and at a different location along the x direction, as shown in the FIG. 10. Each of the reference planes 1005*a*-1005*e* may include a y-directional cross section view of staircase structure 400.

In some aspects, reference lines 840*a* and 840*b* in FIG. 8A form reference plane 1005*a* in FIG. 10, reference lines 840*c* and 840*d* in FIG. 8A form reference plane 1005*b* in FIG. 10, and so on. In some aspects, reference lines 840*a* and 840*b* may be different locations along the y direction (e.g., different values of the y coordinate) and may be at the same location along the x direction (e.g., same value of the x coordinate). Reference lines 840*c* and 840*d* may be different locations along the y direction (e.g., different values of the y coordinate) and may be at the same location along the x direction (e.g., same value of the x coordinate). Reference lines 840*e* and 840*f* may be at different locations along the y direction (e.g., different values of the y coordinate) and may be at the same location along the x direction (e.g., same value of the x coordinate). Reference lines 840*g* and 840*h* may be at different locations along the y direction (e.g., different values of the y coordinate) and may be at the same location along the x direction (e.g., same value of the x coordinate). Reference lines 840*i* and 840*j* may be at different locations along the y direction (e.g., different values of the y coordinate) and may be at the same location along the x direction (e.g., same value of the x coordinate). In some aspects, reference lines 840*a*, 840*c*, 840*e*, 840*g* and 840*i* may be the same location along the y direction (e.g., same value of the y coordinate). In some aspects, reference lines 840*b*, 840*d*, 840*f*, 840*h* and 840*j* may be the same location along the y direction (e.g., same value of the y coordinate).

Figure 8C:
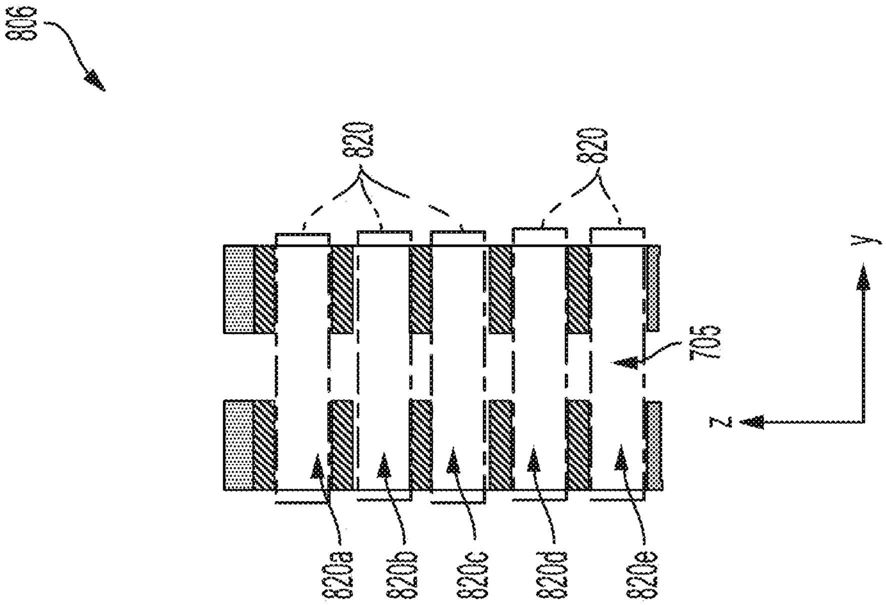
Figure 8B:
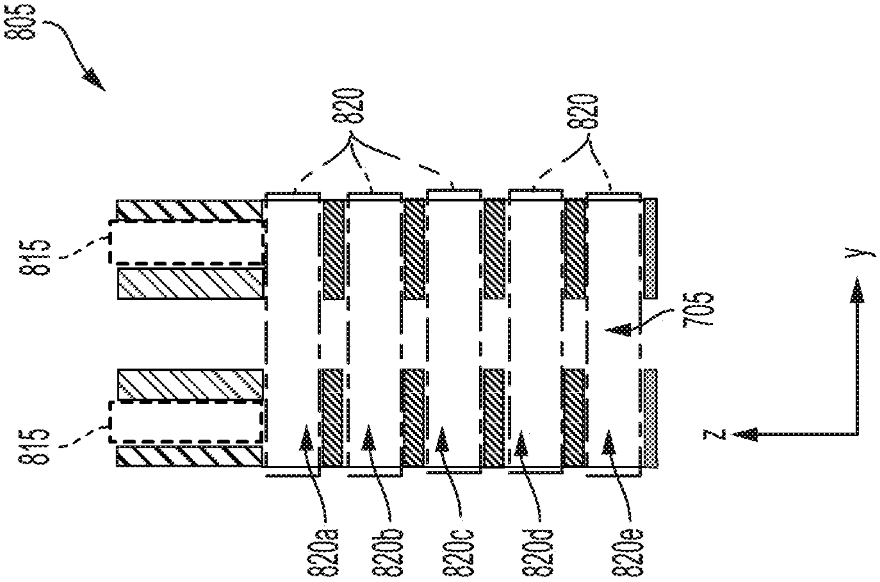

In staircase structure 400, cross-sectional views illustrate first cavities 805 along reference planes 1005*a*-1005*e* (see FIG. 10). In some embodiments, a cavity 805 in staircase structure 400 can include a first cavity portion 815 and a second cavity portion 820 (see FIG. 8B). In some aspects, cavity 805 may not be connected with the remaining portions 810. Referring to FIG. 8B, first cavity portion 815 is formed by removing first spacer layer 505 in stack of dielectric material 512 disposed on sidewalls 430 of openings 405. First cavity portion 815 extends in a vertical direction (e.g., a z-direction) and connects through to second cavity portion 820. Second cavity portion 820 is formed by partially etching the exposed sidewalls of a selection of layers in dielectric film stack 305, as described above. The etching process performed on the exposed sidewalls of dielectric layer film stack 305 can be substantially in a lateral direction (e.g., a y direction). Second cavity portion 820 can include lateral cavities 820*a*-820*e*. Each lateral cavity 820*a*-820*e* extends in a lateral direction (e.g., a y-direction) and aligns with a level 425 in staircase structure 400. The alignment of each lateral cavity 820*a*-820*e* with a level 425 of staircase structure 400 provides the basis to forming self-aligning word line contact structures in staircase structure 400, which will be described in further detail below.

In addition, lateral cavities 820*a*-820*e* in second cavity portion 820 of each cavity 805 are stacked to align with a corresponding slit 705 that provided the opening for partial etching to form lateral cavities 820*a*-820*e*. The number of lateral cavities 820*a*-820*e* in second cavity portion 820 of each cavity 805 can vary through staircase structure 400 to create a staircase structure configuration, according to some embodiments. For example, in the embodiment shown in FIGS. 8A-8C, reference plane 1005*a* illustrates a cavity 805 including five lateral cavities 820*a*-820*e*, while reference plane 1005*b* illustrates a cavity 805 including four lateral cavities 820*b*-820*e*, and so forth. This forms a staircase structure 400 where the number of lateral cavities incrementally decrease along the x direction. For example, cavity 805 illustrated in reference plane 1005*b* includes a lower number of lateral cavities than cavity 805 illustrated in reference plane 1005*a*. The staircase structure configuration of staircase structure 400 affects the flow of electricity through semiconductor device 300, as explained in further detail below with reference to FIG. 10. In other embodiments, other staircase structure configurations are available, such as a second configuration shown in FIGS. 12 and 13, described in further detail below. The staircase structure configurations described in the present disclosure are for illustrative purposes only and are not considered to be exhaustive. Other staircase structure configurations including a different number of lateral cavities in second cavity portion 820 of each cavity 805 can be used.

Referring to FIGS. 8A and 8B, first cavity portion 815 of first cavities 805 in staircase structure 400 connects to a topmost lateral cavity in second cavity portion 820. For example, in the cross-sectional view along reference plane 1005*a*, first cavity portion 815 connects through to lateral cavity 820*a* located on a topmost level 425 of the illustrated cavity 805 in staircase structure 400. In the cross-sectional view along reference plane 1005*b*, first cavity portion 815 connects through to lateral cavity 820*b* located on a topmost level 425 of the illustrated cavity 805, wherein the topmost lateral cavity 820*b* of reference plane 1005*b* is located on a lower level 425 in staircase structure 400 than the topmost lateral cavity 820*a* of reference plane 1005*a*.

In channel regions 335, cross-sectional views illustrate second cavities 806 (see FIG. 8A). Referring to FIG. 8C, second cavities 806 in channel regions 335 include second cavity portion 820 but do not include first cavity portion 815 of first cavities 805. In some embodiments, each cavity 806 in channel region 335 can include the same number of lateral cavities in second cavity portion 820. For example, each cavity 806 in channel region 335 can include the same number of lateral cavities as a cavity 805 in staircase structure 400. For example, in the embodiment shown in FIG. 8A, second cavities 806 in channel region 335 can include five lateral cavities 820*a*-820*e* in order to conduct electricity flow through staircase structure 400, which includes reference plane 1005*a* with five lateral cavities 820*a*-820*e*. In other embodiments, staircase structure 400 can include a reference plane with a different number of lateral cavities, such as 32 lateral cavities, 64 lateral cavities, 128 lateral cavities, etc. In such embodiments, second cavities 806 can include a different number of lateral cavities (e.g., 32 lateral cavities, 64 lateral cavities, 128 lateral cavities, etc.), respectively corresponding to the number of lateral cavities in a reference plane of staircase structure 400. The number of lateral cavities provided herein is for illustrative purposes and not intend to be limiting. In some embodiments, a suitable number of additional lateral cavities can be formed above or below lateral cavities 820*a*-820*e*.

Figure 9A:
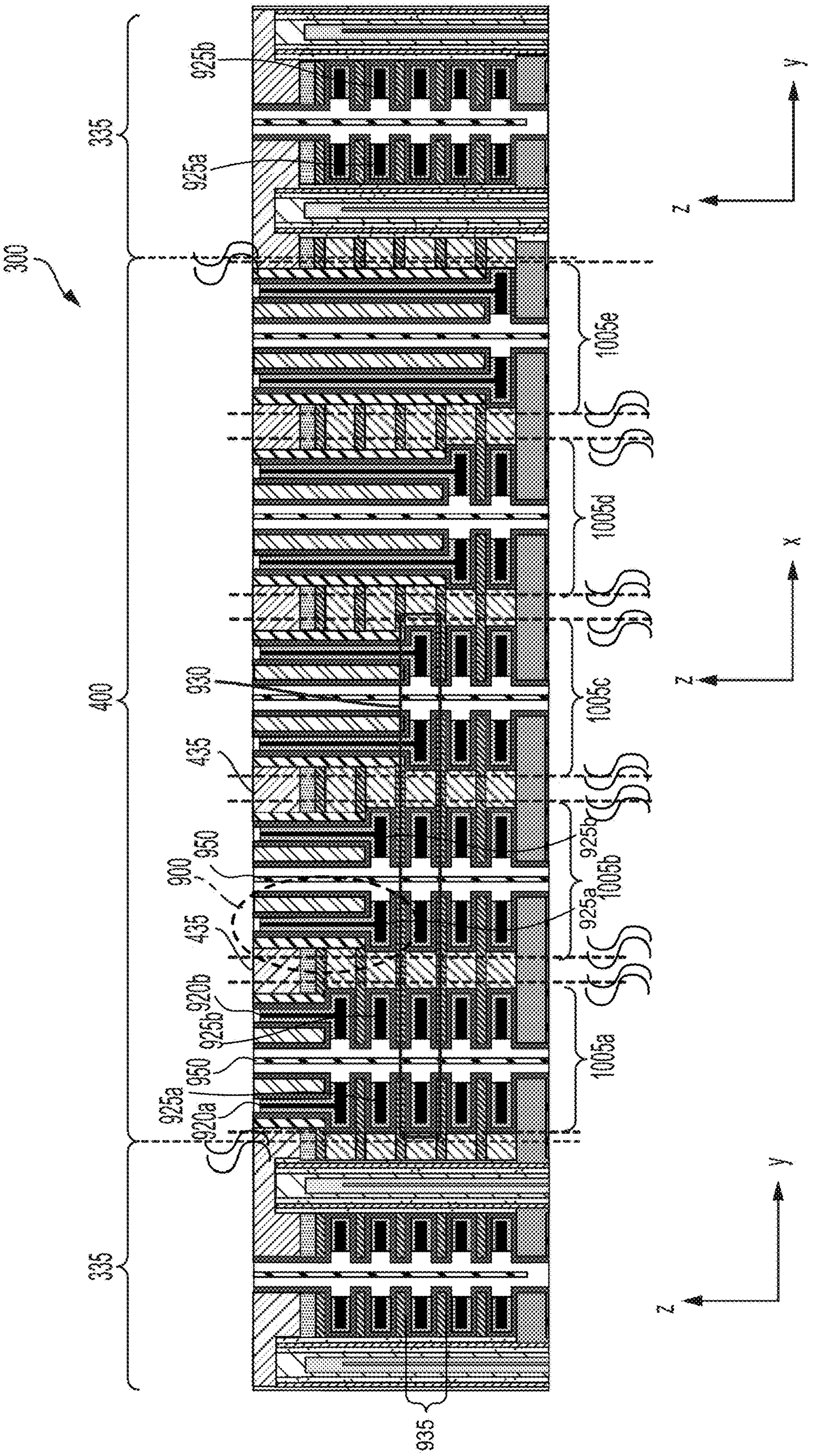
Figure 9B:
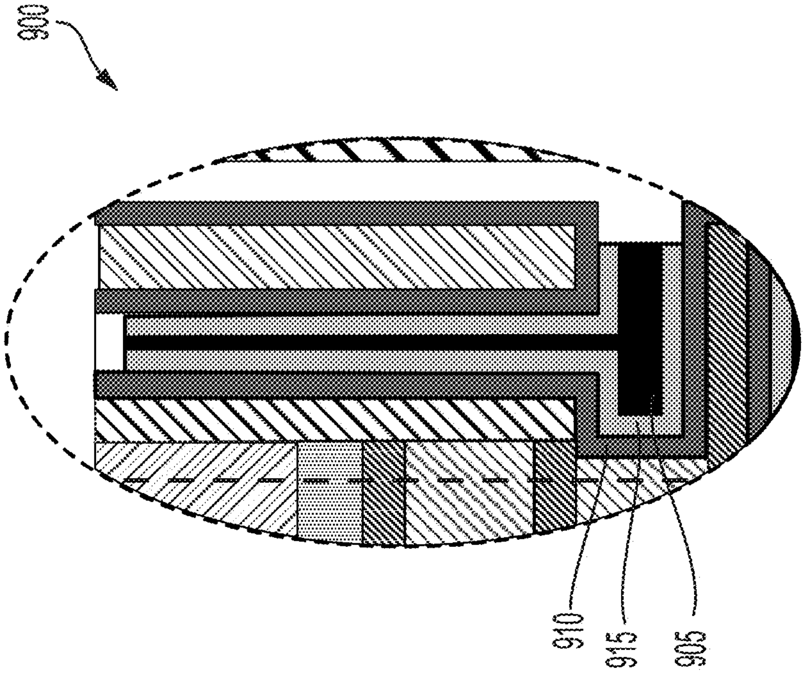

Referring to FIG. 2, at operation S235, contacts (e.g., contract structure 900) are formed in first cavities 805 and second cavities 806, according to some embodiments. As shown in FIGS. 9A and 9B, contract structure 900 includes, a gate dielectric layer 910, a first conductive layer 915, and a second conductive layer 905. The gate dielectric layer 910 is first disposed in each first cavity 805 and second cavity 806. Gate dielectric layer 910 can be disposed in each first cavity 805 and second cavity 806 such that gate dielectric layer 910 lines exposed surfaces of each cavity 805, 806. In some embodiments, gate dielectric layer 910 can be a uniform layer (e.g., having substantially the same thickness). In some embodiments, a first conductive layer 915 can also be disposed in each first cavity 805 and second cavity 806 to line gate dielectric layer 910.

A second conductive layer 905 can then be disposed to fill each first cavity 805 and second cavity 806, thereby forming contacts (see FIG. 9B). In staircase structure 400, depositing second conductive layer 905 to fill first cavities 805 creates at least one pillar contact pair 920 in first cavity portion 815 of first cavities 805. Each pillar contact pair 920 can include a first pillar contact 920*a* formed on a first side of a corresponding slit 705 and a second pillar contact 920*b* formed on a second side (e.g., an opposite side of the first side in the y direction) of the corresponding slit 705. A gate line 950 can be formed in the center of the slit 705. Similarly, in staircase structure 400, depositing second conductive layer 905 to fill first cavities 805 creates at least one lateral contact pair 925 in second cavity portion 820 of first cavities 805. Each lateral contact pair 925 can include a first lateral contact 925*a* and a second lateral contact 925*b*, formed by an etch-back process on lateral contact pairs 925 in second cavity portion 820. First lateral contact 925*a* can be formed on the first side of a corresponding slit 705, and second lateral contact 925*b* can be formed on the second side (e.g., an opposite side of the first side in the y direction) of the corresponding slit 705. Lateral contact pairs 925 can be located between adjacent dielectric layers and separated by second dielectric layers 320, according to some embodiments.

In staircase structure 400, pillar contact pair 920*a*, 920*b* extends in a vertical direction (e.g., a z direction) and electrically connects to a respective lateral contact pair 925*a*, 925*b* located in a topmost lateral cavity of second cavity portion 820. In other words, pillar contact pair 920*a*, 920*b* electrically connects to lateral contact pair 925*a*, 925*b* formed in the lateral cavity of second cavity portion 820 that connects to first cavity portion 815, as explained with reference to FIG. 8B above. Lateral contacts pairs 925*a*, 925*b* located in each level 425 of staircase structure 400 form a word line 930, as shown in FIG. 9A. Word lines 930 extend in an x-direction of semiconductor device 1000 and can conduct electricity between reference planes 1005*a*-1005*e*, as explained in detail below with reference to FIGS. 9A-10.

Furthermore, in channel regions 335, the process of depositing second conductive layer 905 in second cavities 806 creates at least one lateral contact pair 925 in each lateral cavity 820*a*-820*e* of second cavity portion 820 of second cavities 806. Similar to the process conducted on staircase structure 400, an etch-back process can be conducted on each lateral contact pair 925 in channel regions 335 to form a first lateral contact 925*a* on the first side (e.g., left side) of a corresponding slit 705 and a second lateral contact 925*b* on the second side (e.g., right side) of the corresponding slit 705. As such, lateral contact pairs 925*a*, 925*b* can be stacked to align with the corresponding slit 705 such that each level 425 of dielectric film stack 305 includes a lateral contact pair 925*a*, 925*b* in channel regions 335. This allows for electricity flow through semiconductor device 300 along word lines 930, as explained in further detail below with reference to FIGS. 9A and 10.

Referring to FIG. 9A, adjacent lateral contact pairs 925*a*, 925*b* located on the same level 425 (i.e., level 935) in staircase structure 400 form a word line 930 extending in the x-direction (see FIG. 10). In some embodiments, word line 930 can conduct electricity along the x-direction between reference planes 1005*a*-1005*e* through contact pairs 925*a*, 925*b* (see FIG. 10). Electrical conductivity of word line 930 can be determined by dimensions of the cross-sectional area of word line 930. In some embodiments, electrical conductivity of word line 930 can be substantially proportional to a width 436 in the y direction of un-etched column 435 (see FIG. 10). For example, the larger the width 436 in the y direction of un-etched column 435, the smaller the cross-sectional area of lateral contacts 925*a* and 925*b*, which in turn increases the electrical conductivity of word line 930. Therefore, an electrical conductivity of the semiconductor device can be controlled by varying the width 436 in the y direction of each un-etched column 435 to change the electrical conductivity between adjacent lateral contacts 925*a*, 925*b* in each word line 930 in staircase structure 400.

Referring to FIG. 9A, word line 930 can conduct electricity flow along the x-direction (see FIG. 10) between reference planes 1005*a*-1005*e* if there is adjacent lateral contacts 925*a*, 925*b* in a direction of the desired electricity flow. Similar to FIG. 8A, it should be noted that each reference plane 1005*a*-1005*e* shows a cross-sectional view along the y-direction of semiconductor device 1000 and placed consecutively in the x direction in FIG. 9A for simplicity and convenience of presentation. In other words, each consecutive reference plane 1005*a*-1005*e* span across the x-direction of semiconductor 1000, therefore electricity flow along the x-direction between reference planes through staircase structure 400. For example, with reference to FIG. 9A, word line 930 located on a level 935 of staircase structure 400 can conduct electricity flow in the x-direction from reference plane 1005*b* to reference plane 1005*a* because adjacent lateral contacts 925*a*, 925*b* exist in level 935 in reference plane 1005*a*. In other words, lateral contact 925*a* or 925*b* can extend in the x direction from reference plane 1005*a* to reference plane 1005*b*. Similarly, word line 930 located on level 935 of staircase structure 400 can also conduct electricity flow in the x-direction from reference plane 1005*b* to reference plane 1005*c* because adjacent lateral contacts 925*a*, 925*b* exist in level 935 in reference plane 1005*c*. However, in the depicted embodiment of FIG. 9A, word line 930 located in level 935 of staircase structure 400 may not conduct electricity flow in the x-direction from reference plane 1005*c* to reference plane 1005*d* because no adjacent lateral contacts 925*a*, 925*b* exist in level 935 in reference plane 1005*d*. In other words, lateral contact 925*a* or 925*b* may not extend in the x direction from reference plane 1005*c* to reference plane 1005*b*. In this embodiment, in order to conduct electricity from reference plane 1005*c* to reference plane 1005*d* on level 935, the electricity can flow through lateral contacts 925*a*, 925*b* in channel structure 335 and a shared conductive path, as explained in further detail below with reference to FIG. 10. Therefore, the configuration of staircase structure 400 and the existence of lateral contacts 925*a*, 925*b* in an adjacent reference plane in staircase structure 400 can determine the direction of electricity flow through the semiconductor device. In other embodiments with a different configuration of staircase structure 400, the direction of electricity flow can be different. For example, a second configuration of staircase structure 400 is described in further detail with reference to FIGS. 12-13 below.

Figure 11:
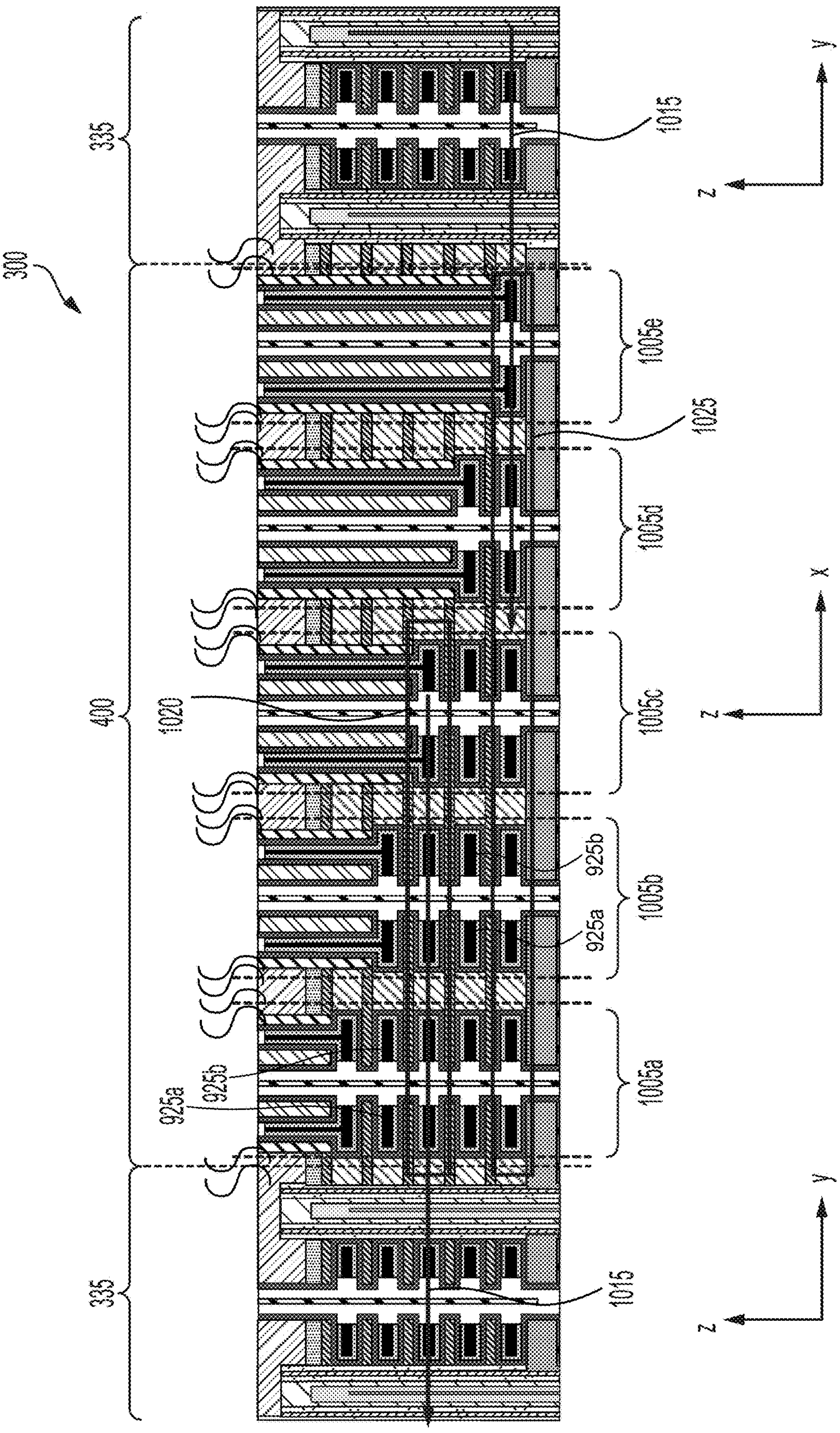
FIG. 11 illustrates a schematic cross-sectional view showing the conduction of electricity through a 3D memory device, according to some embodiments of the present disclosure.

FIG. 10 illustrates a schematic top-down view of a semiconductor device 1000. As shown in FIG. 10, semiconductor device 1000 includes a staircase region 330 and a channel region 335. Staircase region 330 includes staircase structure 400 shown in FIGS. 3A-9A. Word lines 930 extend in an x-direction through staircase region 330 of semiconductor device 1000 and can conduct electricity between reference planes 1005*a*-1005*e*, as explained above. A conductive path 1010 can be used to conduct electricity flow, according to some embodiments. For example, as explained above with reference to FIG. 9A, word line 930 located in level 935 of staircase structure 400 may not conduct electricity flow in the x-direction from reference plane 1005*c* to reference plane 1005*d* because no adjacent lateral contacts 925*a*, 925*b* exist in the same level 935 of reference plane 1005*d*. Therefore, in order to conduct electricity flow from reference plane 1005*c* to reference plane 1005*d*, electricity can flow via a route 1015, shown in FIGS. 10 and 11. Along the route 1015, electricity can flow in the x-direction along a first word line 1020 (see FIG. 11) from reference plane 1005*c* to reference plane 1005*b* to reference plane 1005*a*, reaching a channel region 335 located on a left-end of semiconductor device 1000. The left-end channel region 335 conducts the electricity via channel structures 340 in the y-direction to a conductive path 1010 (see FIG. 10). The conductive path 1010 extends continuously through staircase region 330 to connect the left-end channel region 335 to a channel region 335 located on a right-end of semiconductor device 1000 (see FIG. 10). Electricity is conducted through conductive path 1010 from the left-end channel region 335 to the right-end channel region 335. The right-end channel region 335 conducts the electricity via channel structures 340 in the y-direction to a second word line 1025 (see FIG. 11) with lateral contacts 925*a*, 925*b* that can conduct the electricity from the right-end channel region 335 to reference plane 1005*e* to reference plane 1005*d*. As shown in FIG. 11, first word line 1020 can be a word line 930 located in a different layer in dielectric film stack 305 from second word line 1025, according to some embodiments.

Figure 12:
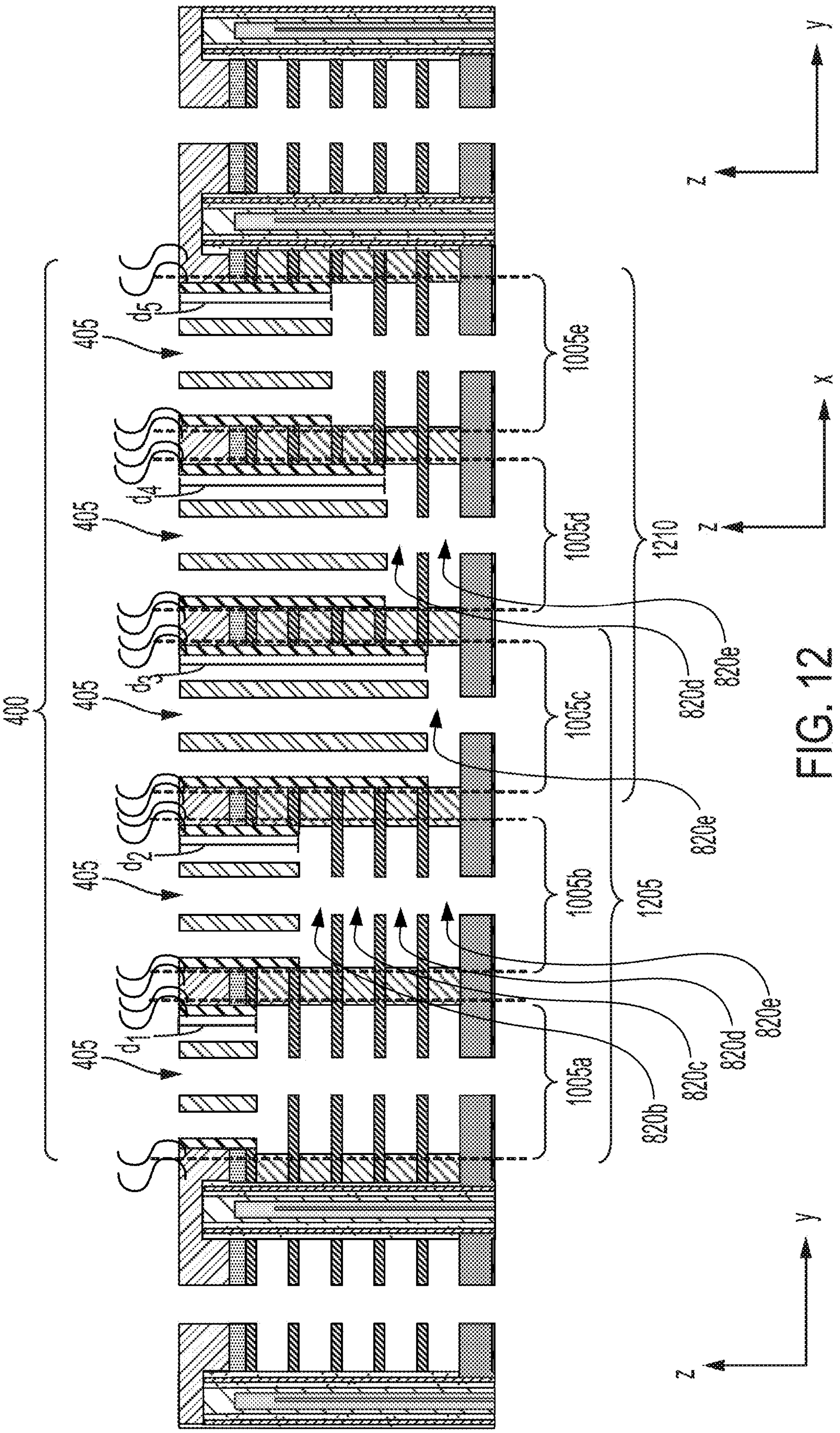
FIGS. 12 and 13 illustrate schematic cross-sectional views of various fabrication stages of another staircase structure configuration for a 3D memory device, according to some embodiments of the present disclosure.
Figure 13:
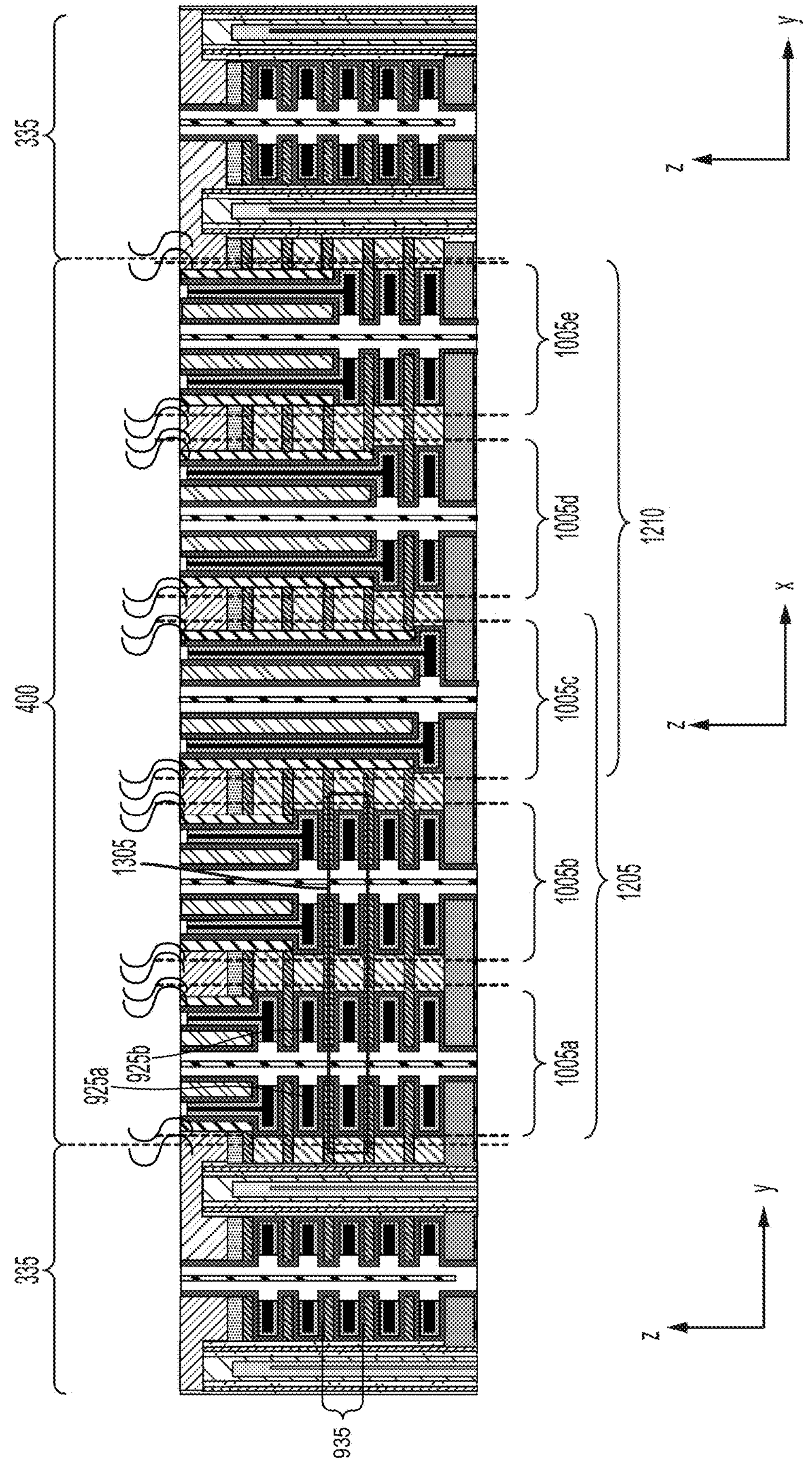

Referring to FIGS. 12-13, a second configuration of staircase structure 400 is shown according to another embodiment. FIG. 12 shows the fabrication process of the second configuration, and FIG. 13 shows the cross-sectional view of the second configuration once the fabrication process was complete. Since the fabrication process in FIG. 12 is similar to the fabrication process with reference FIG. 8A described above, the fabrication process shown in FIG. 12 is omitted herein for simplicity.

As shown in FIGS. 12 and 13, the second configuration of staircase structure 400 includes a staircase structure 400 where the number of lateral cavities incrementally decreases in a first portion 1205 and incrementally increases in a second portion 1210. For example, with reference to FIG. 12, first portion 1205 of staircase structure 400 can include reference planes 1005*a*-1005*c*, while second portion 1210 of staircase structure 400 can include reference planes 1005*c*-1005*e*. In first portion 1205, cavity 805 illustrated in reference plane 1005*c* includes a lower number of lateral cavities than cavity 805 illustrated in reference plane 1005*b* (e.g., reference plane 1005*c* includes lateral cavity 820*e* whereas reference plane 1005*b* includes lateral cavities 820*b*-820*e*). Likewise, cavity 805 illustrated in reference plane 1005*b* includes a lower number of lateral cavities than cavity 805 illustrated in reference plane 1005*a*. On the other hand, in second portion 1210, cavity 805 illustrated in reference plane 1005*e* includes a higher number of lateral cavities than cavity 805 illustrated in reference plane 1005*d*. Likewise, cavity 805 illustrated in reference plane 1005*d* includes a higher number of lateral cavities than cavity 805 illustrated in reference plane 1005*c* (e.g., reference plane 1005*d* includes lateral cavities 820*d*-820*e* whereas reference plane 1005*c* includes lateral cavity 820*e*). When word lines are formed in the second configuration of staircase structure 400 (see FIG. 13), the second configuration affects the direction that electricity is able to flow through various word lines in staircase structure 400. For example, referring to FIG. 13, word line 1305 located on level 935 of staircase structure 400 can conduct electricity flow in the x-direction from reference plane 1005*b* to reference plane 1005*a*. However, in the second configuration of staircase structure 400 shown in FIG. 13, word line 1305 located on level 935 may not conduct electricity flow in the x-direction from reference plane 1005*c* to reference plane 1005*b* because no lateral contacts 925*a*, 925*b* exist on level 935 in reference plane 1005*c*. In contrast, in the previously described configuration illustrated in FIG. 9A, word line 930 located on the same level 935 of staircase structure 400 can conduct electricity flow in the x-axis from reference plane 1005*c* to reference plane 1005*b* because lateral contacts 925*a*, 925*b* exist on level 935 in both reference plane 1005*c* and reference plane 1005*b*. Therefore, the configuration of staircase structure 400 and the existence of lateral contacts 925*a*, 925*b* in an adjacent reference plane in staircase structure 400 can determine the direction of electricity flow through the semiconductor device.

Various embodiments in accordance with the present disclosure provide structures and fabricating methods for forming self-aligning word line contact structures in 3D memory devices. A staircase structure is formed by disposing layers to form a dielectric film stack and etching the dielectric film stack. In some embodiments, openings can be formed in dielectric film stack such that each opening exposes a portion of a lateral surface of one layer of the layers. The method can dispose a spacer layer on sidewalls of the openings and dispose an insulating layer on the spacer layer to fill the openings. A slit can be formed extending through the staircase structure and through the disposed insulating layer, wherein the slit exposes sidewalls of the layers. The method can etch a selection of layers of the layers to create a plurality of first cavities, and remaining portions of the selection of layers that is un-etched can form a part of a plurality of un-etched columns. Furthermore, the method can include forming a plurality of lateral contacts in the first cavities.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:

channel structures in a first region;

a plurality of word line cavity structures in a second region abutting the first region, wherein the plurality of word line cavity structures extend along a first direction, and wherein each of the word line cavity structures comprises:

a first contact structure in a first side of the word line cavity structure along a second direction perpendicular to the first direction, and a second contact structure in a second side of the word line cavity structure along the second direction, wherein the second side is opposite to the first side; and a slit structure, wherein the first contact structure and the second contact structure are separated with the slit structure along the second direction.

2. The memory device of claim 1, the first contact structure or the second contact structure comprises a lateral contact portion positioned along the second direction and extending along the first direction.

3. The memory device of claim 2, the first contact structure or the second contact structure comprises a vertical contact portion connected with the lateral contact portion.

4. The memory device of claim 1, the first contact structure or the second contact structure comprises a gate dielectric layer, a first conductive material layer and a second conductive material layer.

5. The memory device of claim 1, wherein the first and second directions are parallel to a top surface of a substrate.

6. The memory device of claim 1, wherein the plurality of the word line cavity structures form a staircase structure in the second region and wherein the each of the plurality of the word line cavity structures form a step in the staircase structure in the second region.

7. The memory device of claim 6, and wherein a number of steps increases along the first direction.

8. The memory device of claim 6, wherein a number of steps decreases along the first direction.

9. The memory device of claim 1, the plurality of word line cavity structures further comprising:

a first word line cavity structure, and a second word line cavity structure, wherein the first word line cavity structure is located at a different height in a third direction than the second word line cavity structure, wherein the third direction is orthogonal to the first direction and the second direction.

10. The memory device of claim 9, wherein the first word line cavity structure comprises a first width in the second direction, the second word line cavity structure comprises a second width in the second direction, wherein the first width and the second width is approximately the same.

11. The memory device of claim 9, wherein the first word line cavity structure is aligned with the second word line cavity structure at a same location along the first direction.

12. The memory device of claim 9, wherein the first word line cavity structure is not electrically connected with the second word line cavity structure.

13. The memory device of claim 9, the plurality of word line cavity structures further comprising:

a third word line cavity structure, wherein the second word line cavity structure is located at a same height in the third direction as the second word line cavity structure.

14. The memory device of claim 13, wherein the third word line cavity structure is electrically connected with the second word line cavity structure.

15. The memory device of claim 13, wherein the third word line cavity structure is separated by a distance with the second word line cavity structure in the first direction.

16. The memory device of claim 13, wherein the first word line cavity structure, the second word line cavity structure, and the third word line cavity structure form a staircase structure in the second region.

17. The memory device of claim 13, wherein the second word line cavity structure and the third word line cavity structure are connected with a conductive path to the channel structures.

18. The memory device of claim 1, wherein an electrical conductivity of the each of the word line cavity structures is associated with a cross-sectional area of the first contact structure and the second contact structure, and wherein the cross-sectional area comprises the cross-sectional area in the first direction and the second direction.

19. The memory device of claim 1, wherein the first contact structure is separated with the slit structure by a first distance in the second direction, wherein the second contact structure is separated with the slit structure by a second distance in the second direction, and wherein the first distance is substantially the same as the second distance.

20. A memory system, comprising:

a controller; and a memory device coupled to the controller, the memory device comprising:

channel structures in a first region;

a plurality of word line cavity structures in a second region abutting the first region, wherein the plurality of word line cavity structures extend along a first direction, and wherein each of the word line cavity structures comprises:

a first contact structure in a first side of the word line cavity structure along a second direction perpendicular to the first direction, and a second contact structure in a second side of the word line cavity structure along the second direction, wherein the second side is opposite to the first side; and a slit structure, wherein the first contact structure and the second contact structure are separated with the slit structure along the second direction.

* * * * *